Oct. 7, 1969 C. H. McIVER ET AL 3,470,611

SEMICONDUCTOR DEVICE ASSEMBLY METHOD

Filed April 11, 1967

INVENTORS
CHANDLER H. McIVER
SIDNEY R. SIEGEL
WILLIAM W. WHITE, Jr.

BY William J. Simmons Jr.

ATTORNEY 3,470,611
Patented Oct. 7, 1969

3,470,611

SEMICONDUCTOR DEVICE ASSEMBLY METHOD

Chandler H. McIver, Sunnyvale, Calif., Sidney R. Siegel, Horseheads, N.Y., and William W. White, Jr., Raleigh, N.C., assignors to Corning Glass Works, Corning, N.Y., a corporation of New York Filed Apr. 11, 1967, Ser. No. 630,043
Int. Cl. H01l 7/24, 7/16
U.S. Cl. 29—590 5 Claims

ABSTRACT OF THE DISCLOSURE

A method is disclosed for directly attaching semiconductor chip devices to thin film circuits. A semiconductor chip, on which solder coated copper contacts have been predeposited, is placed on a thin film circuit so that the soldered contacts are in engagement with the conductors of the thin film circuit. The simultaneous application of ultrasonic energy and thermal energy to the assembly provides a superior mechanical and electrical connection between the chip and the thin film circuit.

Figure 2:
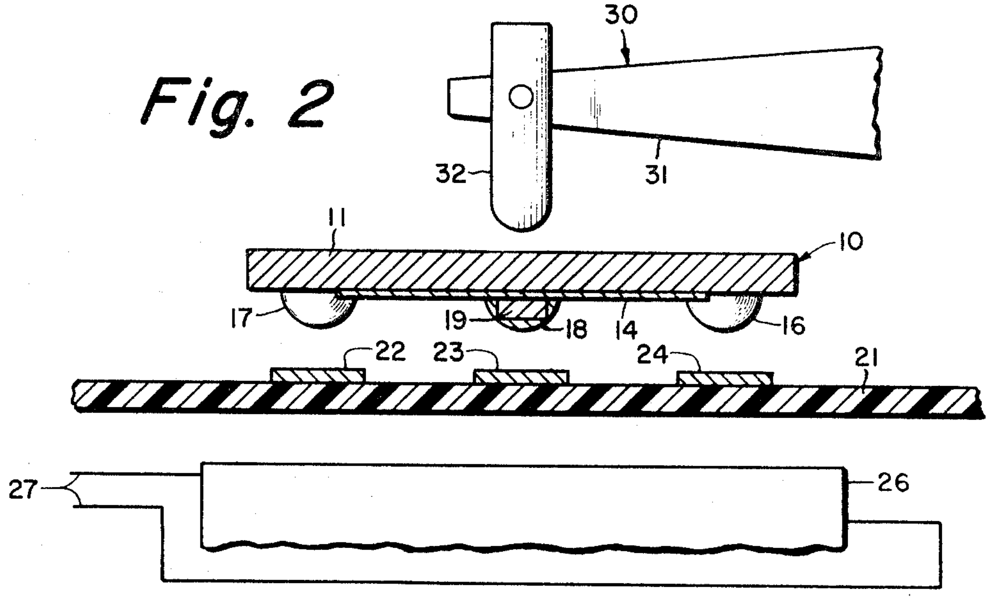

In accordance with this invention, a semiconductor device assembly consists of a planar insulating substrate on which thin conductive films are disposed in predetermined areas or paths to form electrical connections between selected points on the substrate. The terminals of individual semiconductor chips are connected to predetermined points on the thin film paths of the circuit board so that a plurality of chips may be connected with each other and to other circuit elements such as resistances, capacitances and the like to perform an overall function. The semiconductor chips include active areas to which metallic contacts or pillars are connected. At the present time, various methods are used to connect the metallic contacts of the semiconductor chip to the conductive areas of the circuit board.

One such method uses bonded wires for connecting the semiconductor chip to the thin film circuit board. Although these wires are connected at both ends, one end to the semiconductor chip and the other to the thin film circuit board, the connections are mechanically unsound. Undue stress is placed on the welds at the ends of the wires since the central portions of the wires are free to move.

In an effort to mechanically strengthen the connection between the semiconductor chip and the thin film circuit board, some circuit fabricators have begun to directly bond the metallic contacts of the chip to the thin film paths on the circuit board. At the present time this is being done by one of two separate and distinct methods. One such method consists of using aluminum contacts on the semiconductor chip and gold and/or copper paths on the thin film circuit board. The semiconductor chips are positioned on the circuit board so that the metallic contacts of the semiconductor chips engage the proper portions of the thin film circuit board. The connection is made by introducing ultrasonic energy to the semiconductor chip, thereby forming a bond between the circuit board and the aluminum contacts on the semiconductor chip. The disadvantages of this method are the inability of the contacts to achieve adequate mechanical strength and the inability to obtain uniform distribution of ultrasonic energy throughout all contacts. Since there may be as many as fourteen or more contacts per semiconductor chip, this latter disadvantage may be an important consideration in choosing the best contact method. Non-uniform height of the aluminum contacts may reduce the accuracy of placement of the semiconductor devices as well as adversely affect the distribution of ultrasonic energy. This method can therefore result in open contacts as well as mechanically weak joints.

Another bonding method in present use utilizes a solder connection to attach the semiconductor devices to the thin film substrates. Contacts of solder are built up on the semiconductor device and the device is located over the gold and/or copper paths on the substrate. The application of heat by means of a furnace or a moving belt lehr allows the solder to flow and wet the mating paths on the substrate. The bonds thus formed are about as strong as those obtained in the ultrasonic process described hereinabove, and similar disadvantages arise. The uniform connection of all contacts is difficult to obtain. Furthermore, because of oxides, contamination and other problems associated with solder connections, extreme caution must be taken in applying heat. Various processes described in the prior art for making solder connections require that forming gases be used and require critically controlled firing cycles. Such heat can be detrimental to the semiconductors when it is applied over extended periods of time.

Accordingly, it is an object of this invention to provide a method of bonding a semiconductor chip to a thin film circuit board, which method results in high strength connections.

Another object of thts invention is to provide a mechanically and electrically reliable method of directly attaching semiconductor chips to thin film circuits.

Another object of this invention is to provide a semiconductor device assembly method in which the bonds between a semiconductor chip and a thin film circuit board can be readily and economically made.

Briefly, this invention consists of a method for bonding together a semiconductor assembly consisting of a base member and at least one semiconductor chip device. The base member includes an insulating substrate having a thin metallic film disposed thereon in a predetermined pattern, and the semiconductor chip devices have active areas to which metallic contacts or pillars are connected. The bonding method comprises the steps of applying solder to the contacts on a semiconductor chip device, positioning the semiconductor chip device on the substrate so that the soldered contacts of the semiconductor device are in engagement with portions of the thin metallic layer on the substrate, and applying heat to the soldered contacts of the semiconductor device while applying ultrasonic energy and pressure to the semiconductor device.

Figure 1:
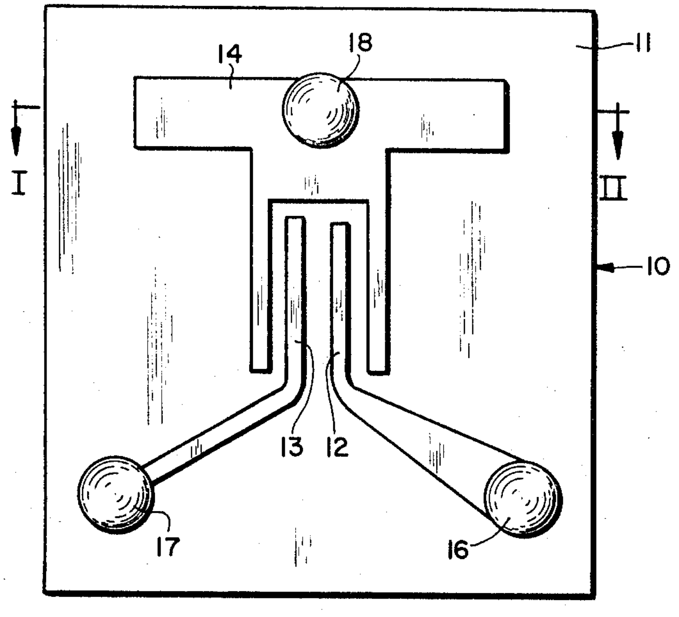

Additional objects, advantages and features of the invention will appear from the following description taken in conjunction with the accompanying drawings in which:

FIG. 1 is a plan view of a semiconductor chip which is illustrative of the type which may be bonded to a thin film electrical circuit in accordance with the bonding method of this invention; and FIG. 2 is an enlarged cross-sectional view showing the apparatus utilized in forming the bond between a semiconductor chip transistor or the like and a thin film circuit.

The semiconductor chip shown in FIG. 1 is merely illustrative of the type of semiconductor active element which may be bonded to a thin film circuit board. This figure shows a plan view of a transistor 10 comprising a semiconductor chip 11 having active areas in the central portion thereof. Thin film metallic paths 12, 13 and 14 provide electrical connection to the emitter, collector and base portions of the transistor. These thin film paths consist of a material such as aluminum which is not easily wet by solder. Metallic contacts or pillars of a material such as copper, which is easily wet by solder, are deposited at desired locations on the aluminum paths 12, 13 and 14. In this figure the copper pillars are shown as being wetted by solder droplets 16, 17 and 18.

The chip 11 is prepared for bonding to a substrate in the following manner. An entire wafer or individual chip is fluxed by placing it in alpha white water rosin or the like. It is then dipped into solder which is maintained at approximately 205° C., and then quickly withdrawn from the solder so that only the copper pillars are wetted. The wave soldering technique, wherein the wafer or chip is passed over a fountain of solder, has also been proven to be satisfactory. The wafer or chip is then cleaned in ethyl alcohol and an ultrasonic vibrator to remove excess flux and contamination. When the above steps have been performed on a wafer, it is then diced into individual chips producing the soldered chip. In the particular embodiment illustrated in FIG. 1, a wafer having a diameter of 1¼ inches is diced into 900 to 1,000 individual semiconductor chips, each being 0.028 inch by 0.028 inch by 0.006 inch thick. The copper pillars on the chip measure about 0.004 inch in diameter by 0.001 inch in thickness.

The apparatus required for bonding the semiconductor chip to a thin film substrate is shown in FIG. 2. A portion of a thin film circuit board is shown as comprising a substrate 21, which is made of a suitbale insulating material, on which a plurality of conductive paths 22, 23 and 24 have been deposited. Paths consisting of thin metal films of gold, copper, or alloys thereof have proven to be satisfactory.

The transistor 10 as shown in FIG. 2 is a cross-sectional view taken along lines II—II of FIG. 1. This view shows one of the copper pillars 19 which is formed on the aluminum path 14. The semiconductor chip 11 is disposed above the circuit board 21, the position in which it is situated prior to the engagement of the soldered contacts 17, 18 and 16 with the conductive thin film paths 22, 23 and 24 respectively. Just prior to placing the chip on the thin film circuit, the substrate may be fluxed in the area where the chip is to be placed to prepare the conductive film on the thin film substrate as well as to hold the chip in place while the bonding action is in process.

The apparatus required for providing a mechanically and electrically superior bond between the semiconductor chip and the substrate includes a heating element 26 and an ultrasonic transducer 30. A pair of conductors 27 connect the heating element 26 to a suitable energizing source (not shown). The ultrasonic transducer 30, which may be the type disclosed in U.S. Patent No. 3,255,511 issued to N. Weissenstern et al., includes a shank portion 31 on which the bonding tip 32 is connected.

The operation of the apparatus shown in FIG. 2 is as follows. After the substrate 21 has been given a coating of flux in the vicinity of the paths 22, 23 and 24, it is placed on the heating element 26 which may be maintained at approximately 228° C. The semiconductor chip 11, which as been presoldered in the manner described hereinabove, is positioned over the mating paths on the substrate either automatically or by hand. The ultrasonic bonding tip 32 is then lowered over the chip and energy is applied. During the application of ultrasonic energy, which may be a pulse of up to approximately one second duration, the solder is melting and wetting to the path on the substrate. The pressure of the bonding tip 32 helps to settle the chip uniformly on the circuit board and insures equal distribution of wetting on all contacts, regardless of the number of contacts required.

The thermal energy for the above process is applied directly to the thin film substrate by means of conduction. No direct heat is applied to the semiconductor other than through the solder connections. In addition the duration of such heat is extremely short and can be localized to the area of semiconductor contact.

After approximately 30 seconds has elapsed, the ultrasonic tip is removed, and the substrate is taken off the heating element. This period of time may vary depending on the number of contacts to be attached. Cooling to ambient temperature occurs immediately, and a superior mechanical and electrical connection results without the need for special atmospheres. After all the bonding operations have been performed on the particular substrate, the entire assembly is cleared with a suitable cleaning agent such as ethyl alcohol.

The above described method provides high strength reliable mechanical and electrical direct attachment of semiconductor chips to thin film circuits. This method offers many advantages over the prior art methods described hereinabove. The mechanical strength of the bond between the three-semiconductor chip device and a thin film circuit formed by either ultrasonic energy or soldering alone ranges from 50 to 75 gms. in shear strength. The method in accordance with this invention results in a mechanical shear strength of 250 gms. The mechanical strength of such connections is more than double that of the prior described methods.

Furthermore, the preparation of the interconnection surfaces is greatly reduced since the ultrasonic energy breaks the oxide surfaces on the gold/copper paths of the thin film circuit at the exact moment that the solder starts to wet. The uniform engagement of all contacts is achieved due to the fact that flowing solder allows the semiconductor chip to settle uniformly with the added pressure and energy provided by the ultrasonic tip. In addition, the ultrasonic energy forms a metallurgical connection between the contacting metals on the semiconductor chip and the substrate. The exact nature of the joint is not clearly understood, but it results in a connection which is mechanically superior to any known in the related prior art.

It is not intended that this invetnion be limited by the specific embodiment described hereinabove since various modifications can be made without departing from the scope thereof. For example, the timing or sequence of the applied ultrasonic and heat energy can be modified from the particular sequence described. The ultrasonic energy may be applied initially before the application of heat, thereby creating a preliminary bond between the chip and the substrate. This assembly could then be thermally bonded to increase the strength of the bond.

What is claimed is:

1. In a method for bonding together a semiconductor assembly consisting of a base member and at least one semiconductor device in which the base member includes an insulating substrate having thin metallic film paths disposed thereon in a predetermined pattern and in which the semiconductor devices have active areas to which metallic contacts are connected, the method comprising the steps of:

(a) applying solder to the contacts on a semiconductor device, (b) positioning said semiconductor device on said substrate so that the soldered contacts of said semiconductor device are in engagement with portions of said thin metallic paths on said substrate, and (c) applying heat to the soldered contacts while applying ultrasonic energy and pressure to said semiconductor device, thereby forming a bond between the metallic contacts on said semiconductor device and the thin metallic film paths on said substrate.

2. A method as in claim 1 wherein the heat is applied locally to the side of said substrate opposite the side to which said semiconductor device is to be attached, the heat being sufficient in temperature and duration to conduct through said circuit board and melt the soldered contacts on said semiconductor device.

3. A method as in claim 1 wherein the step of applying solder to the contacts on said semiconductor device includes the following steps:

(a) fluxing said entire semiconductor device, (b) applying molten solder to said semiconductor device so that only the contacts thereon are wetted, and (c) cleaning said semiconductor device to remove excess flux and contamination.

4. A method as in claim 1 wherein ultrasonic energy is applied to said semiconductor device by pressing an ultrasonic bonding tip on said semiconductor device, and heat is applied locally to the side of said substrate opposite the side to which said semiconductor device is located so that during the application of ultrasonic energy, the solder is melting and wetting a thin metallic film on said substrate, and the pressure of a bonding tip is settling said semiconductor chip uniformly on the substrate to insure equal distribution of wetting on all contacts on the substrate.

5. A method as in claim 1 wherein prior to the step of positioning said semiconductor device on said substrate, said substrate is fluxed in the area where said semiconductor device is to be positioned to assist in holding said semiconductor device in its proper position during the subsequent bonding step and to insure proper wetting of the solder on the thin film paths on said substrate.

References Cited

UNITED STATES PATENTS

| | | | |
|---|---|---|---|
| 3,029,766 | 4/1962 | Jones | 29—470 X |
| 3,255,511 | 6/1966 | Weissenstern | 29—589 |
| 3,292,240 | 12/1966 | McNutt et al. | 29—577 |
| 3,316,458 | 4/1967 | Jenny | 317—101 |
| 3,373,481 | 3/1968 | Lins et al. | 29—577 X |

PAUL M. COHEN, Primary Examiner

U.S. Cl. X.R.

29—493, 497.5, 498, 500, 501, 502, 589